(12) United States Patent
Tashiro et al.

(10) Patent No.: US 9,261,769 B2
(45) Date of Patent: Feb. 16, 2016

(54) IMAGING APPARATUS AND IMAGING SYSTEM

(71) Applicant: CANON KABUSHIKI KAISHA, Tokyo (JP)

(72) Inventors: Kazuaki Tashiro, Ebina (JP); Jun Iba, Yokohama (JP); Satoko Iida, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 194 days.

(21) Appl. No.: 13/751,686

(22) Filed: Jan. 28, 2013

(65) Prior Publication Data

US 2013/0208172 A1   Aug. 15, 2013

(30) Foreign Application Priority Data

Feb. 10, 2012 (JP) .................................. 2012-027724
Jan. 11, 2013 (JP) .................................. 2013-004051

(51) Int. Cl.
| | |
|---|---|
| H04N 5/225 | (2006.01) |
| H04N 9/083 | (2006.01) |
| G03B 33/00 | (2006.01) |
| G02B 19/00 | (2006.01) |
| H01L 27/146 | (2006.01) |

(52) U.S. Cl.
CPC ............ *G03B 33/00* (2013.01); *G02B 19/0014* (2013.01); *G02B 19/0076* (2013.01); *H01L 27/14621* (2013.01); *H01L 27/14627* (2013.01); *H01L 27/14685* (2013.01)

(58) Field of Classification Search
CPC .................. H01L 27/14627; H01L 27/14605; H01L 27/14609; H01L 27/14621; H01L 27/14812; H01L 27/14818; H01L 27/14837; H01L 27/14843; G02B 3/0043; G02B 7/34; G02B 7/36; G03B 13/36; H04N 3/155; H04N 5/02

USPC .......................................... 348/270–277, 340
See application file for complete search history.

(56) References Cited

U.S. PATENT DOCUMENTS

| | | | | |
|---|---|---|---|---|
| 6,638,780 B2 * | 10/2003 | Fukasawa | ............... | H01L 24/97 257/E25.02 |
| 6,638,786 B2 * | 10/2003 | Yamamoto | ........ | H01L 27/14685 438/57 |
| 6,717,151 B2 | 4/2004 | Tashiro et al. | ........... | 250/370.11 |
| 6,800,836 B2 | 10/2004 | Hamamoto et al. | ........ | 250/208.1 |
| 7,625,157 B2 * | 12/2009 | Prichard et al. | ........ | B23C 5/2273 407/113 |
| 7,626,157 B2 * | 12/2009 | Kim | .................. | H01L 27/14603 250/216 |
| 7,812,382 B2 | 10/2010 | Iida | ............................... | 257/292 |
| 8,110,859 B2 | 2/2012 | Iida | ............................... | 257/292 |
| 8,110,885 B2 | 2/2012 | Iida et al. | ...................... | 257/437 |
| 8,164,668 B2 | 4/2012 | Iida et al. | ...................... | 348/308 |
| 8,400,546 B2 | 3/2013 | Itano et al. | ..................... | 348/308 |
| 2010/0231774 A1 | 9/2010 | Tashiro | ........................ | 348/311 |
| 2011/0076001 A1* | 3/2011 | Iwasaki | .................. | G03B 7/099 396/114 |
| 2011/0221947 A1 | 9/2011 | Awazu | .......................... | 348/311 |
| 2013/0119235 A1 | 5/2013 | Iida | ............................. | 250/208.1 |

FOREIGN PATENT DOCUMENTS

| | | | |
|---|---|---|---|
| JP | 2005-167003 A | | 6/2005 |
| JP | 2007-155930 A | | 6/2007 |

* cited by examiner

*Primary Examiner* — Trung Diep
(74) *Attorney, Agent, or Firm* — Fitzpatrick, Cella, Harper & Scinto

(57) ABSTRACT

An imaging apparatus comprising a plurality of pixels each of which includes a photoelectric conversion portion, and a light-condensing portion arranged on the plurality of pixels, wherein the light-condensing portion has an area smaller than an area of the photoelectric conversion portion.

10 Claims, 15 Drawing Sheets

IMAGING APPARATUS AND IMAGING SYSTEM

BACKGROUND OF THE INVENTION

1. Field of the Invention

The present invention relates to an imaging apparatus and imaging system.

2. Description of the Related Art

An imaging apparatus can include microlenses as means for condensing incoming light. However, for example, like a full-HD sensor of a 35-mm full size, an imaging apparatus having a unit pixel larger than a diameter of each microlens used in the related art is known.

SUMMARY OF THE INVENTION

One of the aspects of the present invention provides an imaging apparatus comprising a plurality of pixels each of which includes a photoelectric conversion portion, and a light-condensing portion arranged on the plurality of pixels, wherein the light-condensing portion has an area smaller than an area of the photoelectric conversion portion.

Further features of the present invention will become apparent from the following description of exemplary embodiments with reference to the attached drawings.

DESCRIPTION OF THE EMBODIMENTS

When each individual pixel of an imaging apparatus is covered by one microlens, each individual microlens has to be formed to have a large height.

However, to cover each individual pixel of the imaging apparatus by a microlens having a large height is to impair flatness of the imaging apparatus, and to bring about manufacturing variations such as different heights of individual microlenses. For this reason, it is difficult to control a route of incoming light, and the layout design of pixels is not easy.

In the following embodiments, examples of an imaging apparatus in which a unit pixel is larger than the diameter of a microlens, and which is advantageous for the layout design of pixels will be explained.

First Embodiment

Figure 1:
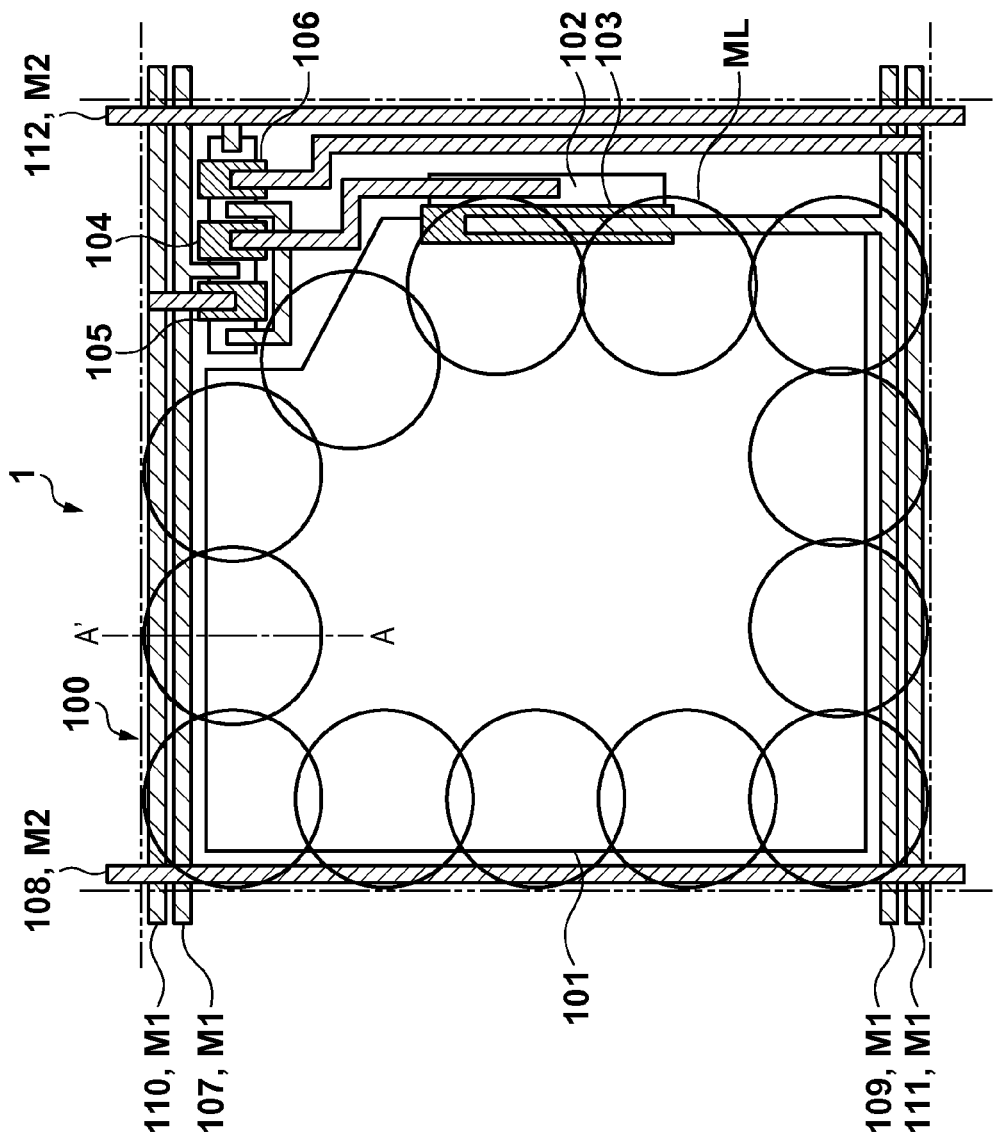
FIG. 1 is a view for explaining an example of the arrangement of the first embodiment.
Figure 2:
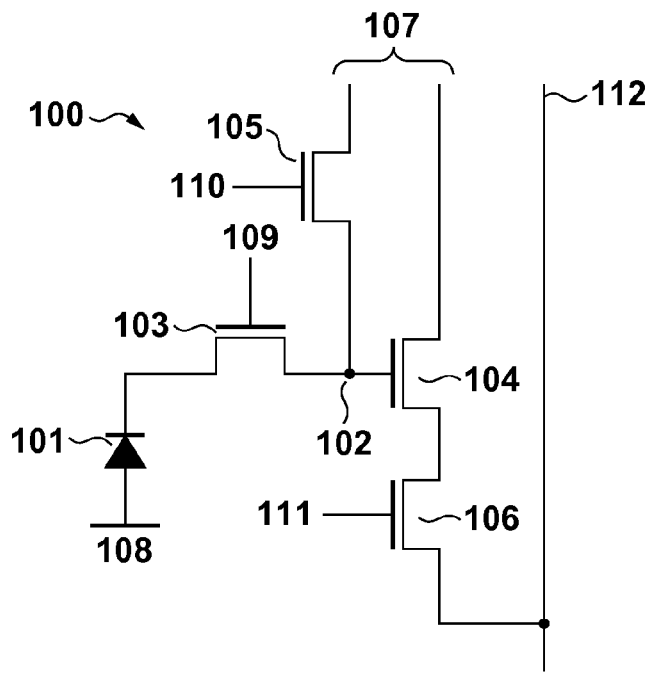
FIG. 2 is a circuit diagram for explaining an example of the arrangement of a pixel.

An imaging apparatus 1 of the first embodiment will be described below with reference to FIGS. 1 to 4. The imaging apparatus 1 comprises a pixel portion (not shown) including a plurality of pixels two-dimensionally arranged on a substrate (for example, a semiconductor substrate). FIG. 1 is a schematic view of a unit pixel 100 of this pixel portion from an upper surface. A size of the pixel 100 is, for example, 20 μm×20 μm. The pixel 100 is configured by a circuit exemplified in FIG. 2. The pixel 100 includes a photoelectric conversion portion (for example, a photodiode 101), transfer transistor 103, floating diffusion 102, amplifier transistor 104, selection transistor 106, and reset transistor 105. A unit pixel 100 includes at least one photoelectric conversion portion, and the other construction may be arbitrarily changeable. The transfer transistor 103 can transfer a charge, which is generated and accumulated in the photodiode 101 based on incoming light, to the floating diffusion 102 in response to a control signal TX input via a control interconnection 109. The amplifier transistor 104 configures a source-follower circuit together with a constant current circuit (not shown). The amplifier transistor 104 converts a charge amount transferred to the floating diffusion 102 into a voltage signal in accordance with that charge amount, and outputs the voltage signal onto a vertical signal line 112. The selection transistor 106 can output a pixel signal output from the amplifier transistor 104 onto the vertical signal line 112 in response to a control signal SEL input via a control interconnection 111. The reset transistor 105 can reset a potential of the floating diffusion 102 in response to a control signal RES input via a control interconnection 110. A power supply interconnection 107 includes a VRES power supply interconnection required to supply a power supply voltage to the reset transistor 105, and a VDD power supply interconnection required to supply a power supply voltage to the amplifier transistor 104, and is connected to a power supply circuit (not shown). A power supply interconnection 108 is a GND interconnection for grounding. The control interconnections 109 to 111 are connected to a vertical scanning circuit (not shown) for controlling each of the pixels 100 of each row in a column direction. The photodiode 101 and the elements 102 to 106 are arranged in the pixel 100, as exemplified in FIG. 1. Power supply interconnections 107 and 108, control interconnections 109 to 111, and the like are arranged on the pixel 100. And a plurality of microlenses ML as light-condensing portions are arranged on the pixel 100. In FIG. 1, a plurality of microlenses ML is arranged for each pixel, but at least one microlens may be arranged for each pixel. A pixel 100 is to show a virtual segmentation on the surface of the substrate. And the elements excluding the photodiode 101 (transistors, lines, for example) can be called the "other elements" in this specification.

Figure 3:
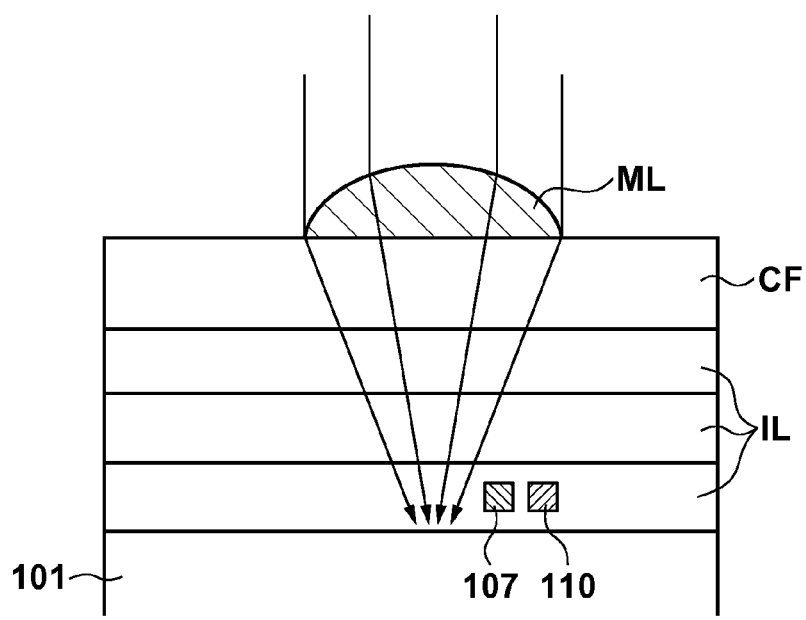
FIG. 3 is a view for explaining a schematic sectional structure of a pixel of the first embodiment.

FIG. 3 is a schematic view of a sectional structure of one of the plurality of microlenses ML taken along a cut line A-A'. On the photodiode 101, for example, three 1-μm thick interlayer dielectric layers IL are formed. For example, using Al interconnections of the first and second layers (the respective Al interconnections are described as M1 and M2 in FIG. 1), the power supply interconnections 107 and 108 and control interconnections 109 to 111 (to be referred to as "respective interconnections" hereinafter) are laid out. The power supply interconnections 107 and 110 formed from the Al interconnections of the first layer are arranged in FIG. 3. Assume that each of the respective interconnections has, for example, an interconnection width=0.5 μm and an interconnection height=0.5 μm. A color filter CF (which can also include a planarizing layer) is formed on the interlayer dielectric layers IL, and the microlens ML is arranged on the color filter CF. The thickness of the color filter CF is 2.2 μm. In this case, a distance from the upper surface of the color filter to that of the photodiode 101 is 5.2 μm.

As exemplified in FIG. 1, the Al interconnections of the first layer are used respectively for the power supply interconnection 107 and control interconnections 109 to 111. These interconnections are arranged along the horizontal direction, and are also connected to other pixels of the same row. These interconnections are respectively connected to predetermined elements of respective pixels via contact holes (not shown) or the Al interconnections of the second layer. The Al interconnections of the second layer are respectively used for the vertical signal line 112 and power supply interconnection 108. These interconnections are arranged along the vertical direction, and are also connected to the elements of the other pixels of the same column. These interconnections are respectively connected to predetermined elements of respective pixels via contact holes or the Al interconnections of the first layer.

In this case, on the pixel 100, as exemplified in FIG. 1, the microlens ML is arranged along the outer edge of the photodiode 101 to deflect a route of light, which becomes incident toward, for example, the other elements and the like of the photoelectric conversion potion, toward the photodiode 101. The microlens ML has a diameter of 4.5 μm and a height of 1.1 μm, that is, it has a smaller area or width (or diameter) than the photodiode 101, and its upper surface has a spherical surface shape.

In this case, the diameter of the microlens indicates that of a circumferential circle of the bottom surface (a surface on the side where the photodiode is arranged) of the microlens. As the diameter of the microlens, when there are portions which contact neighboring microlenses, for example, a diameter may be defined of a non-contact portion. Also, assume that the area of the microlens indicates an area of a shape obtained by projecting the microlens in a direction perpendicular to a plane including the light-receiving surface of the photodiode. In this embodiment, the area of each individual microlens is smaller than that of the photodiode. The width of the photodiode, for example, can be obtained from the orthogonal projection onto the surface of the substrate, and that includes any directions of the width.

The microlens ML was formed using a reflow method as a general manufacturing method. Initially, a photosensitive photoresist (photosensitive resin) for microlenses is coated on a semiconductor substrate on which a pixel portion is formed. More specifically, a planarizing layer is formed on the semiconductor substrate, and the photosensitive photoresist for microlenses is coated on the planarizing layer by spin coating. At this time, the viscosity of the photosensitive photoresist for microlenses and spin coating conditions are set so that the film thickness after baking applied after the spin coating becomes a desired film thickness (for example, 1.1 μm). After that, the baking is performed. Next, the photosensitive photoresist is exposed using a photomask having a pattern corresponding to the layout of the microlenses ML of the present invention. After that, development is performed. Thus, the pattern of the photosensitive photoresist corresponding to the layout of the microlenses ML is formed. Finally, the pattern is heated to be thermally deformed (reflowed), thereby forming the plurality of microlenses ML each having a diameter of 4.5 μm and a height of 1.1 μm, and an upper surface having a spherical surface shape. In this embodiment, the microlenses ML are formed by the reflow method, but they may be formed by other conventional manufacturing methods.

In the above description, the case in which the pixel 100 has the size of 20 μm×20 μm has been examined. This pixel size is larger than the diameter (for example, a diameter of about 10 μm) of a microlens used in the related art. For example, when a spherical microlens, which has a size that covers this pixel 100, is to be formed, for example, one having a height larger than 6 μm has to be formed. However, this may impair the flatness of the imaging apparatus 1, and may bring about manufacturing variations such as different heights of individual microlenses. Also, it becomes difficult to form the upper surface (obverse face) of the microlens to be a spherical surface shape (or a shape having a curvature) with increasing height of the microlens. For this reason, it is difficult to control a route of light entering the pixel 100, and the layout design of the pixel 100 such as the positional relationship between the photoelectric conversion portion, and the other elements and the like, is not easy. However, according to this embodiment, it is possible to control a route of light entering the pixel 100, and the layout design of the pixel 100 can be advantageously made. For example, as shown in FIG. 3, of light rays (arrows of the solid lines) which enter in a direction perpendicular to the pixel 100, those, which enter the control interconnection 110 and power supply interconnection 107, are refracted by the microlens ML toward the photodiode 101. An aperture ratio of the imaging apparatus 1 when no microlenses ML are laid out was 64%, but a practical aperture ratio was improved up to 72%. Also, the sensitivity of the imaging apparatus 1 was improved by 15% compared to a case in which no microlenses ML are laid out.

Figure 4:
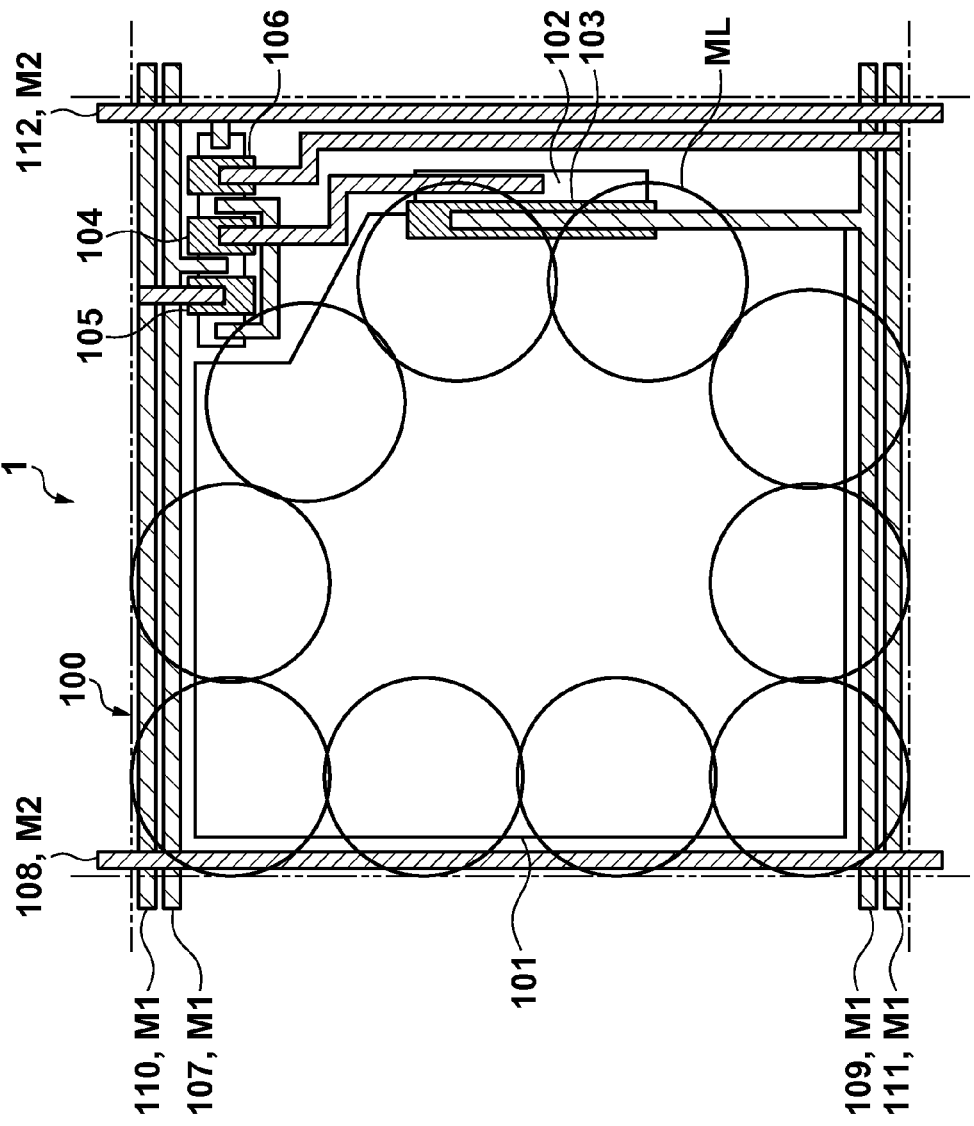
FIG. 4 is a view for explaining another example of the arrangement of the first embodiment.

In this embodiment, the plurality of microlenses ML, each of which has the diameter of 4.5 μm and the height of 1.1 μm and also has the upper surface having the spherical surface shape, are formed. Alternatively, as shown in FIG. 4, microlenses each having a diameter of 5 μm and a height of 1.2 μm may be arranged. In this case as well, a practical aperture ratio was improved up to 72%. In this embodiment, the imaging apparatus is illustrated to have the three-layer structure, and the interconnections are arranged on the first and second layers. For example, the interconnections may also be arranged on the third layer, a light-shielding member may be arranged in place of the interconnections. In this embodiment, each pixel is illustrated as a rectangle. However, each pixel may have another shape, for example, a hexagonal shape, and a plurality of light-condensing portions may be arranged along at least one of a plurality of sides, which define a boundary portion of the pixel. In this embodiment, the microlenses ML are arranged along the outer edge of the photodiode 101. Also, the microlenses ML may also be arranged on a central region so as to uniform the characteristics of the microlenses ML. In this embodiment, a CMOS image sensor has been exemplified as a sensor of the imaging apparatus. Alternatively, for example, any other sensors such as a CCD image sensor may be used.

The shape of each microlens may be defined to have a diameter ranging from about 1 to 10 μm, and a height ranging from about 0.5 to 3 μm. Also, in order to allow the microlens to sufficiently condense light, the microlens can be formed so that, for example, its focal point position is located in the vicinity of the photodiode surface.

In this embodiment, no microlens is arranged on the central portion of the photodiode 101. However, a microlens may be arranged on the central portion of the photodiode so as to uniform the reflection characteristics of the microlens surface.

As described above, according to this embodiment, even in the imaging apparatus in which a unit pixel is larger than a diameter of the microlens that can be manufactured by the related art, a route of light which enters the other elements and the like can be controlled, and the layout design of the pixel 100 can be advantageously made.

Second Embodiment

Figure 5:
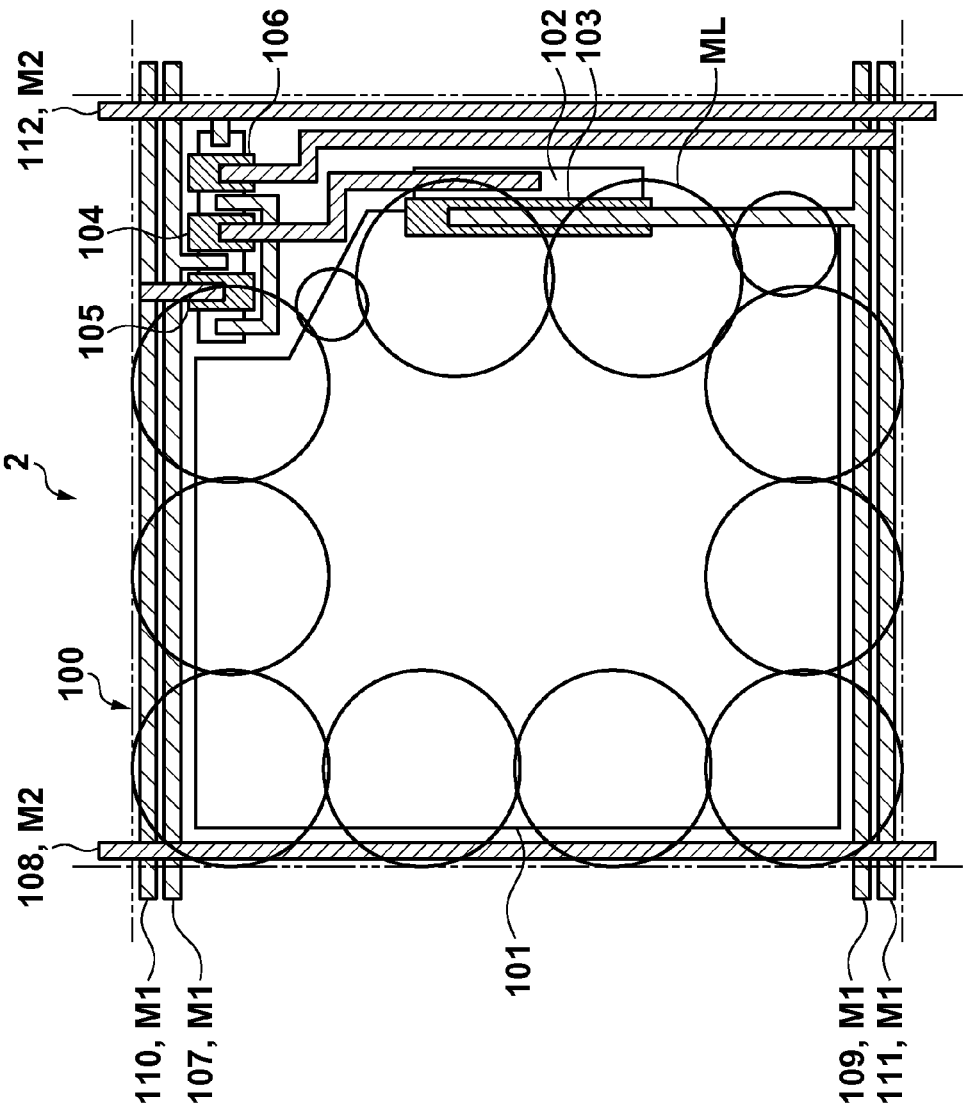
FIG. 5 is a view for explaining an example of the arrangement of the second embodiment.

An imaging apparatus 2 of the second embodiment will be described below with reference to FIG. 5. In the first embodiment, the microlenses ML having the same diameter are arranged. However, in this embodiment, microlenses ML having different diameters are arranged, as shown in FIG. 5, unlike in the first embodiment. In this case, layout positions of a plurality of microlenses ML are changed as needed according to the shape of a photodiode and interconnection layout, and microlenses having different diameters are combined to allow the more advantageous layout design. FIG. 5 is a top view of a pixel 100 on which microlenses having a diameter of 5 μm and a height of 1.2 μm, that having a diameter of 3 μm and a height of 0.8 μm, and that having a diameter of 2 μm and a height of 0.7 μm are arranged in combination. In this case, a practical aperture ratio was improved up to 75%. In this manner, the microlenses having different diameters can be densely arranged around a photodiode 101 in combination, and the microlenses ML can also be arranged in a gapless manner. Each microlens ML having a spherical surface shape can have, for example, a diameter ranging from 1 to 10 μm and a height ranging from about 0.5 to 3 μm. However, as the diameter and height, appropriate values can be selected so that the focal point position of the microlens ML is located above the photodiode 101.

According to this method, even with a pixel size larger than a 10 μm×10 μm size, light, which enters the other elements and the like of the pixel 100, can be more efficiently condensed on the photodiode 101, thus allowing the more advantageous layout design.

Third Embodiment

Figure 6:
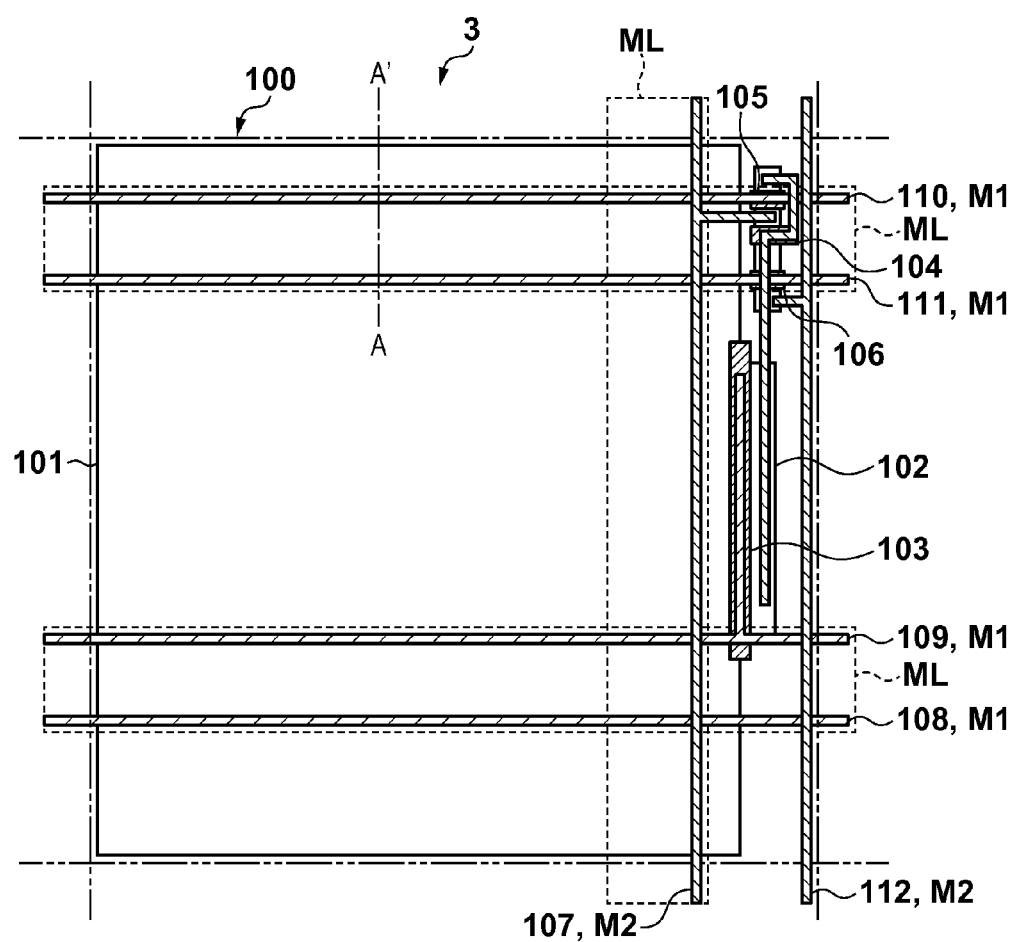
FIG. 6 is a view for explaining an example of the arrangement of the third embodiment.

An imaging apparatus 3 of the third embodiment will be described below with reference to FIGS. 6 to 9. In the first and second embodiments, the microlenses ML, each of which has the upper surface having the spherical surface shape, are arranged. However, in this embodiment, cylindrical lenses ML, each of which has an upper surface having a cylindrical surface shape, are arranged at positions shown in FIG. 6 unlike in the first and second embodiments. Since reference numerals and symbols in FIG. 6 are the same as those in the first and second embodiments, a description thereof will not be repeated. In this case, a size of a pixel 100 is, for example, 50 μm×50 μm. In this embodiment as well, the layout positions of the cylindrical lenses ML can be decided according to a layout of the other elements and the like. Thus that allows the advantageous layout design.

Figure 7:
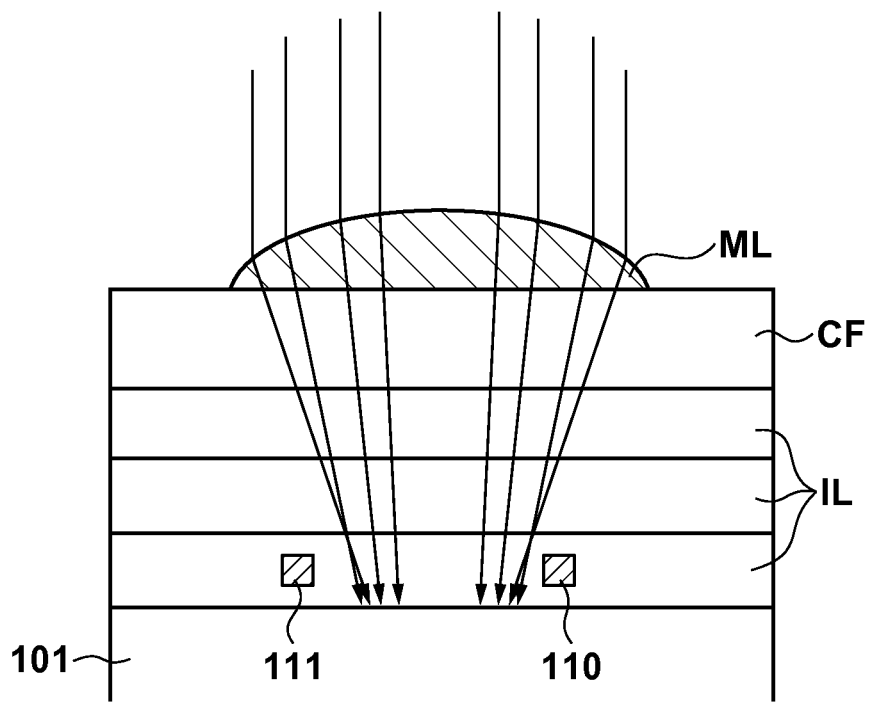
FIG. 7 is a view for explaining a schematic sectional structure of a pixel of the third embodiment.

FIG. 7 is a schematic view of the sectional structure of one of the cylindrical lenses ML taken along a cut line A-A'. In this case, for example, three 1.2-μm thick interlayer dielectric layers IL are formed on a photodiode 101. Also, each interconnection has, for example, an interconnection width of 0.6 μm and an interconnection height of 0.6 μm. A thickness of a color filter CF is 2 μm. In this case, a distance from the upper surface of the color filter to that of the photodiode 101 is 5.6 μm. Also, the cylindrical lens ML can be formed to have, for example, a height of about 3 μm. In this embodiment, the cylindrical lens ML having a width of 7 μm and a height of 2 μm was formed.

As shown in FIG. 7, of light rays (arrows of solid lines) which perpendicularly enter the pixel 100, those which enter control interconnections 110 and 111 are refracted by the cylindrical lens ML toward the photodiode 101. Originally, a region where each interconnection is arranged serves as a light-shielding region which intercepts incoming light. However, according to this embodiment, light which has entered this region can be used as an optical signal, thus allowing a practical aperture ratio to be improved.

Figure 8:
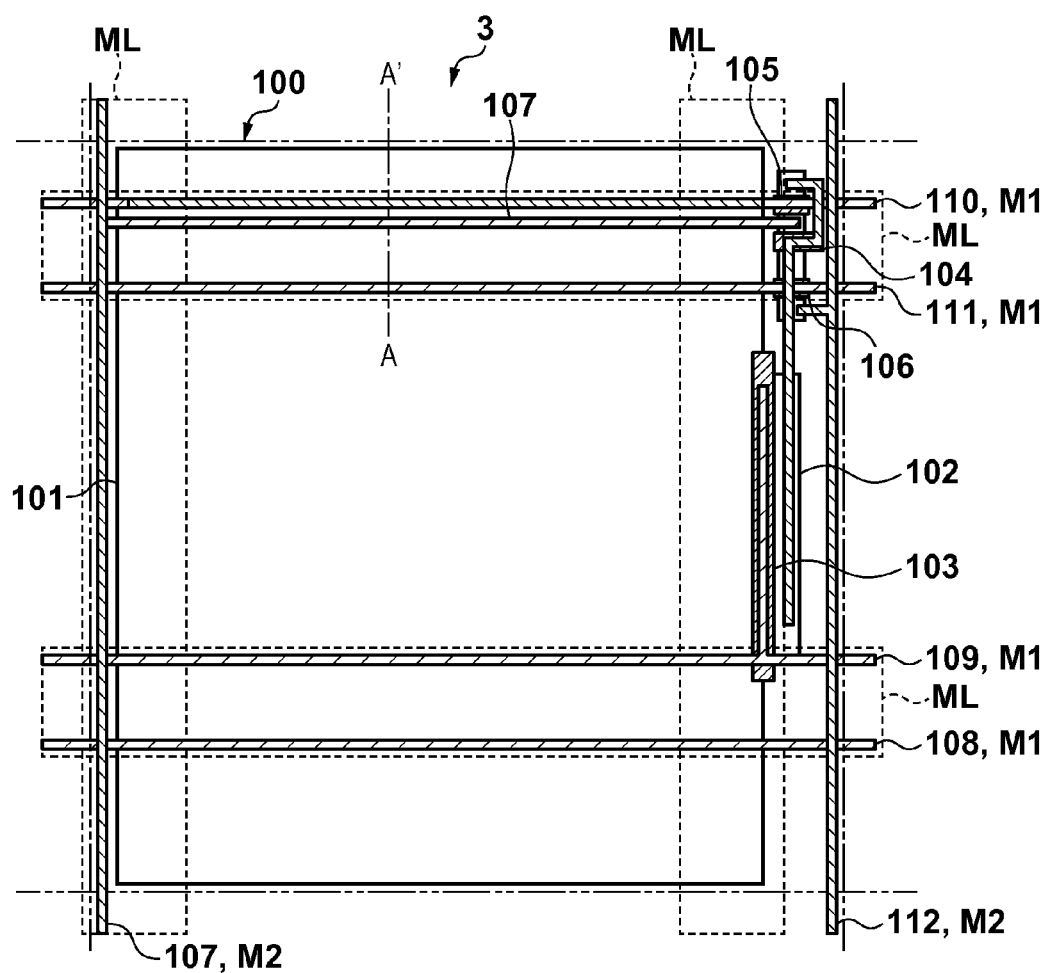
FIG. 8 is a view for explaining another example of the arrangement of the third embodiment.
Figure 9:
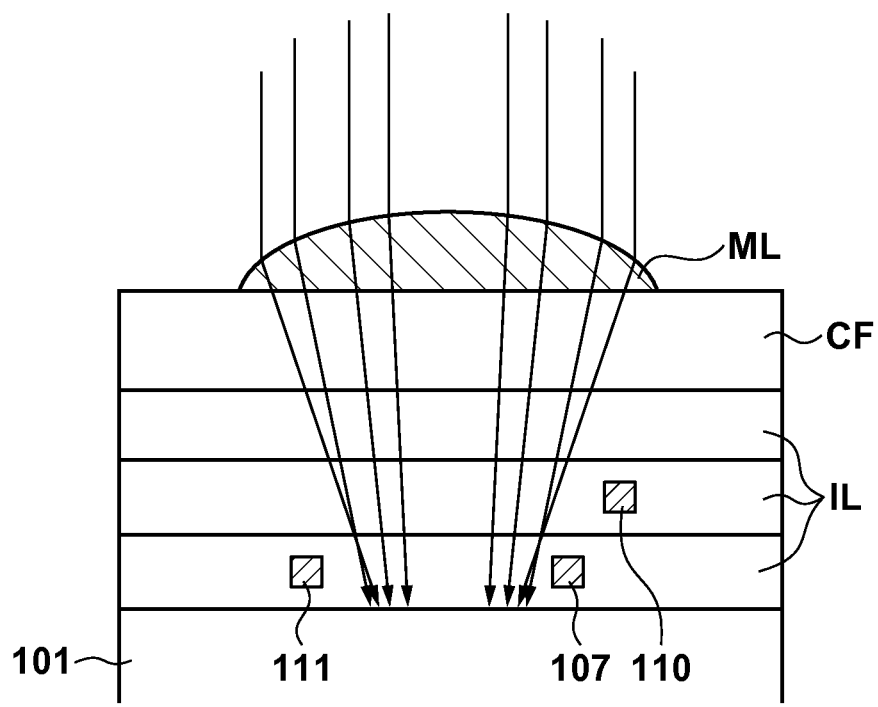
FIG. 9 is a view for explaining a schematic sectional structure of a pixel of the third embodiment.

According to this method, respective interconnections can also be arranged while being branched in vertical and horizontal directions, as exemplified in FIG. 8. For example, as shown in FIG. 8, a power supply interconnection 107 using a second layer is arranged along the vertical direction. Also, an interconnection using a first layer, which is used to supply this power supply voltage to a transistor, is arranged along the horizontal direction. FIG. 9 is a schematic view of the sectional structure taken along a cut line A-A' in this case. For example, when two cylindrical lenses ML are respectively arranged to cross each other above these interconnections, light rays, which enter these interconnections, can be refracted toward the photodiode 101.

This embodiment uses the cylindrical lens ML having the width of 7 μm and the height of 2 μm. When a cylindrical lens having a size larger than this is to be formed, coating properties, exposure characteristics, and development characteristics of a photoresist may impair. When a cylindrical lens having a width larger than 10 μm is to be formed by, for example, the reflow method or etch-back method, it is difficult to form the lens to have a spherical surface shape. In this case, the height of the cylindrical lens ML is set to be 2 μm lower than a limit value of a height that can be formed using existing materials of the lens, thereby enhancing the reproducibility. Also, since the width of the lens is set to be 7 μm, the sectional shape is formed to be closer to an arc. The sectional shape is preferably an arcuate shape, but light need only be condensed by end regions of the section if the sectional shape is not an arcuate shape.

The width of the cylindrical lens in the pixel is defined by a length of its bottom surface (a surface on the side where the photodiode is arranged) in the section in a direction perpendicular to the central axis of a curvature of the cylindrical surface shape. Also, the area of the cylindrical lens indicates that of a shape obtained by projecting the lens in a direction perpendicular to a plane including the light-receiving surface of the photodiode. In this embodiment, the area of each individual cylindrical lens is smaller than that of the photodiode.

As described above, according to this embodiment, even in the imaging apparatus in which a unit pixel is larger than a diameter of the microlens that can be manufactured by the related art, a route of light which enters the other elements and the like can be controlled, and the layout design of the pixel 100 can be advantageously made.

Fourth Embodiment

Figure 10:
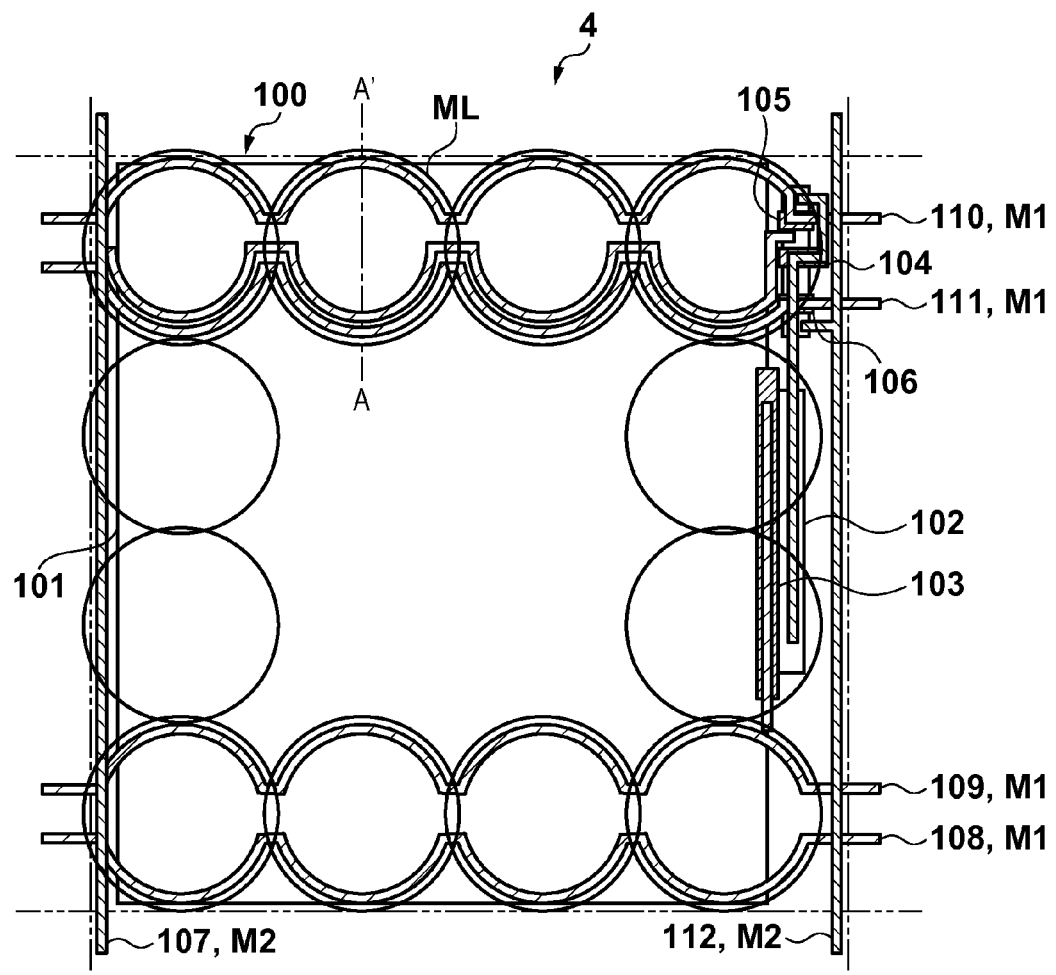
FIG. 10 is a view for explaining an example of the arrangement of the fourth embodiment.

An imaging apparatus 4 of the fourth embodiment will be described below with reference to FIGS. 10 to 12. In this embodiment, as exemplified in FIG. 10, respective interconnections are arranged along the inner side of outer edges of microlenses ML each having a spherical surface shape unlike in the first and second embodiments. Reference numerals and symbols in FIG. 10 are the same as those in the first to third embodiments, and a description thereof will not be repeated. In this embodiment, a size of a pixel 100 is, for example, 50 μm×50 μm. In this embodiment as well, the layout positions of the microlenses ML can be decided according to a layout of the other elements and the like. Thus that allows the advantageous layout design.

Figure 11:
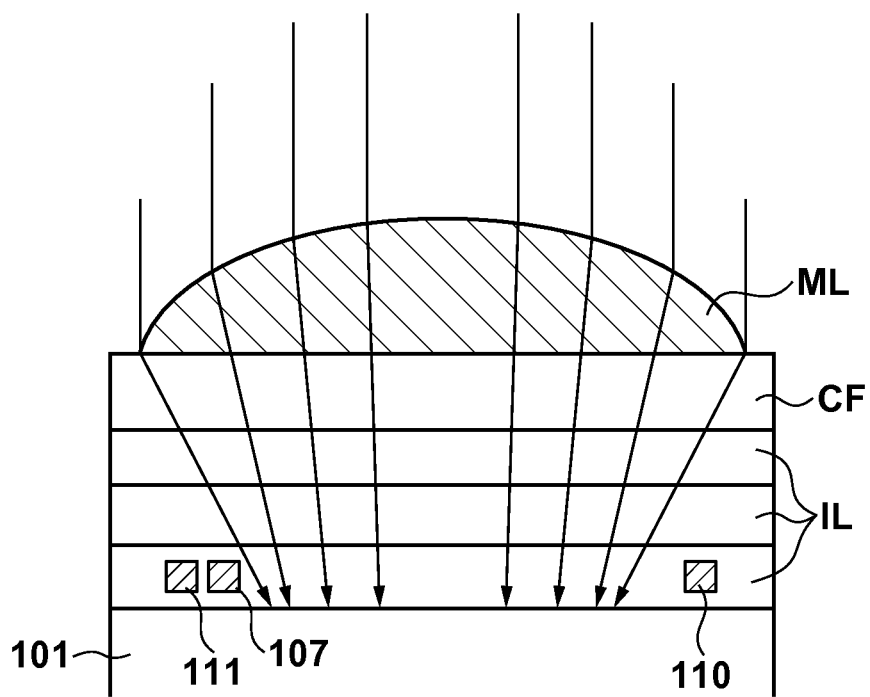
FIG. 11 is a view for explaining a schematic sectional arrangement of a pixel of the fourth embodiment.
Figure 12:
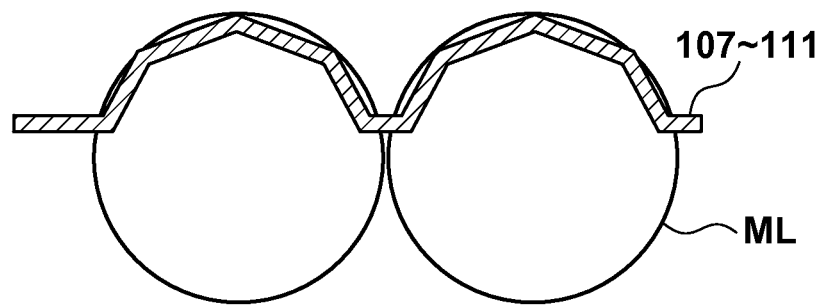
FIG. 12 is a view for explaining another example of the arrangement of the fourth embodiment.

FIG. 11 is a schematic view showing the sectional structure of one of the microlenses ML taken along a cut line A-A'. In this case, for example, three 1.2-μm thick interlayer dielectric layers IL are formed on a photodiode 101. Each interconnection has, for example, an interconnection width of 0.6 μm and an interconnection height of 0.6 μm. A thickness of a color filter CF is 2.2 μm. In this case, a distance from the upper surface of the color filter to that of the photodiode 101 is 5.8 μm. Also, each microlens ML can be formed to have, for example, a height of about 3 μm. In this embodiment, microlenses ML having a diameter of 13 μm and a height of 3 μm were formed in the same manner as in the first embodiment.

As shown in FIG. 11, of light rays (arrows of solid lines) which perpendicularly enter the pixel 100, those which enter a power supply interconnection 107 and control interconnections 110 and 111, are reflected by the microlens ML toward the photodiode 101. Originally, a region where each interconnection is arranged serves as a light-shielding region which intercepts incoming light. However, according to this embodiment, light which has entered this region can be used more effectively as an optical signal.

In FIG. 10, the respective interconnections (the power supply interconnection 107 and control interconnections 110 and 111 in this case) were arranged to draw arcs along the inner side of the outer edges of the microlenses ML. However, light rays which enter the respective interconnections need only be refracted toward the photodiode 101, and the respective interconnections may be arranged to have corner portions, as shown in FIG. 12.

As described above, according to this embodiment, even in the imaging apparatus in which a unit pixel is larger than a diameter of the microlens that can be manufactured by the related art, a route of light which enters the other element and the like can be controlled, and the layout design of the pixel 100 can be advantageously made.

Fifth Embodiment

In the fifth embodiment, respective color filters CF are arrayed according to a Bayer matrix, and microlenses ML are arranged between neighboring pixels unlike in the structure of the first embodiment. Assume that each color filter CF is arranged in correspondence with each pixel.

Figure 14:
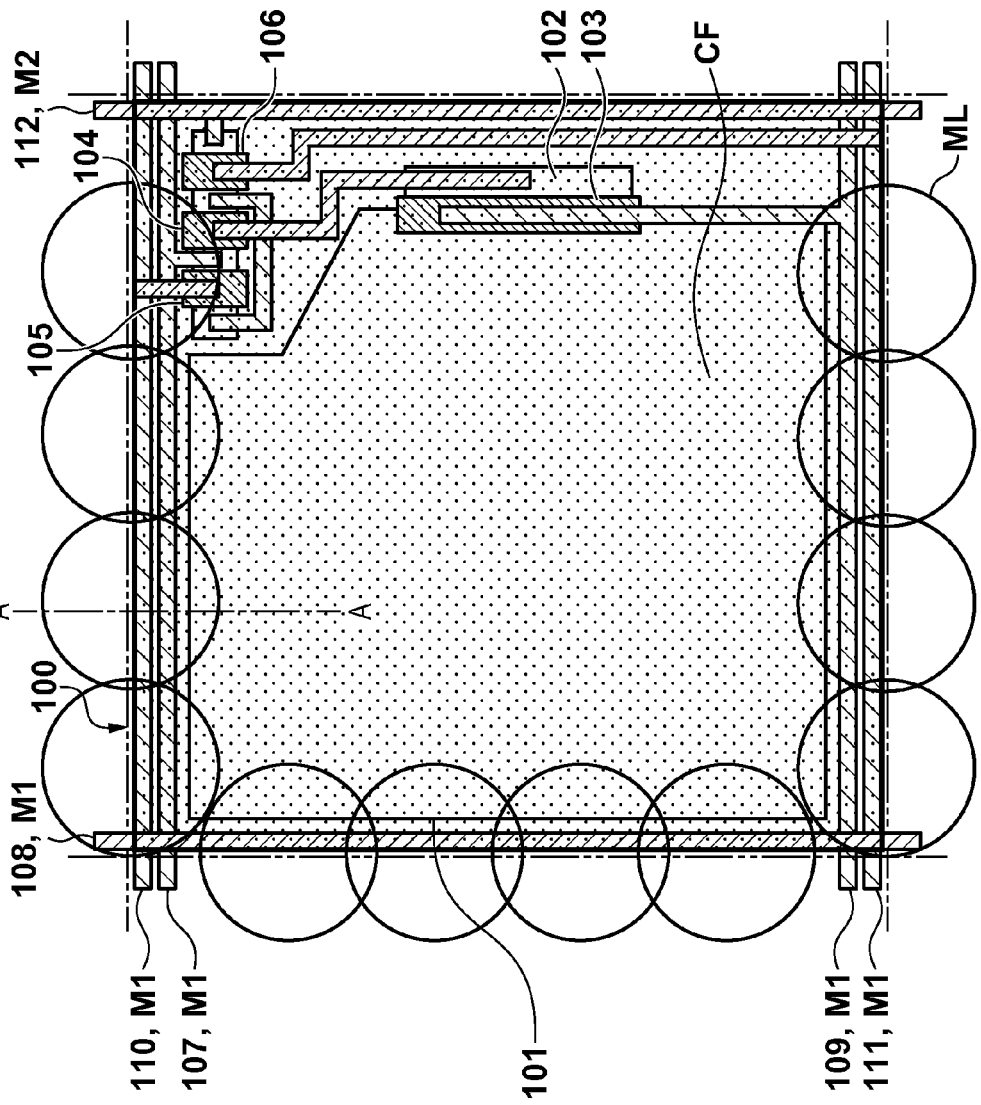
FIG. 14 is a view for explaining an example of the arrangement of the fifth embodiment.

FIG. 14 is a schematic view of a unit pixel 100 of a pixel portion in this embodiment, when it is illustrated from the upper surface side. The arrangement shown in FIG. 14 is the same as that of the first embodiment (FIG. 1) except for the layout positions of the microlenses ML. As shown in FIG. 14, a pixel $100_1$ (first pixel) and pixel $100_2$ (second pixel) are adjacent to each other, and the microlenses ML are laid out to cover a portion of the pixel $100_1$ and that of the pixel $100_2$, which are adjacent to each other.

Figure 15:
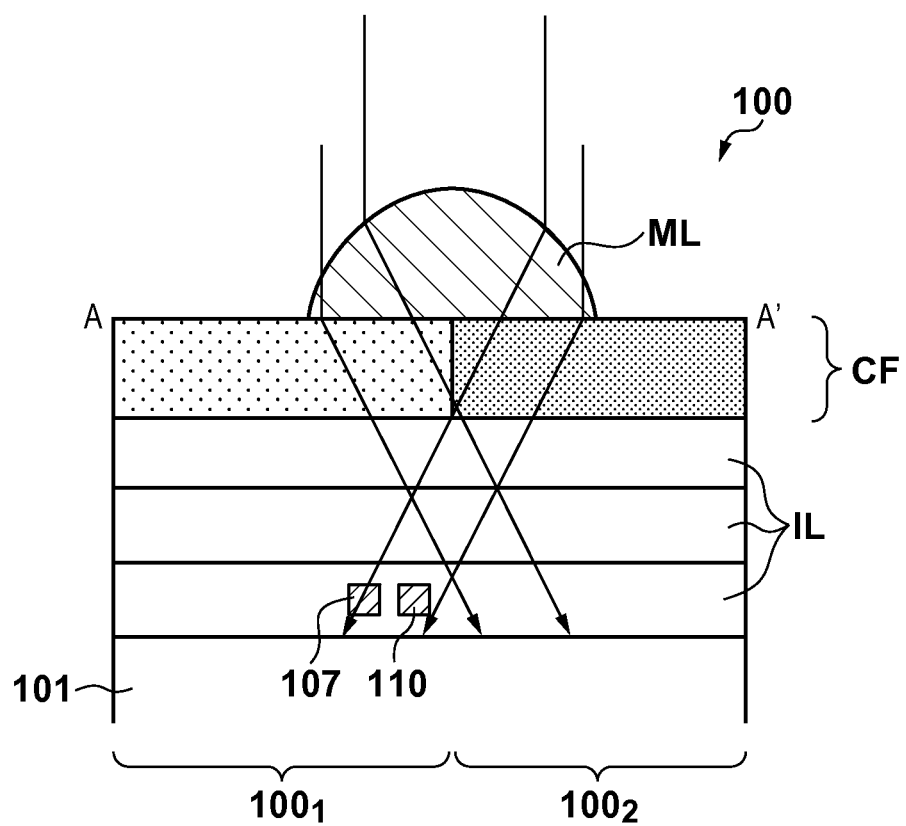
FIG. 15 is a view for explaining a schematic sectional arrangement of a pixel of the fifth embodiment.

FIG. 15 is a schematic view of the sectional structure taken along a cut line A-A' of FIG. 14. This sectional structure is mainly different from that of the first embodiment (FIG. 3) in that the microlenses ML are laid out to cover a portion of the pixel $100_1$ and that of the pixel $100_2$, which are adjacent to each other.

With this structure, the microlens ML can refract some of light rays, which perpendicularly enter the side of the pixel $100_1$, toward the side of the pixel $100_2$. Likewise, the microlens ML can refract some of light rays, which perpendicularly enter the side of the pixel $100_2$, toward the side of the pixel $100_1$.

As described above, according to this embodiment, in each pixel 100, some chief rays can be purposely refracted toward the adjacent pixel. Thus, the pixel can assume the same role as a birefringent plate or optical low-pass filter, and can prevent interference fringes caused by a fine stripe pattern or the like, thereby eliminating false color and moiré.

Sixth Embodiment

Figure 16:
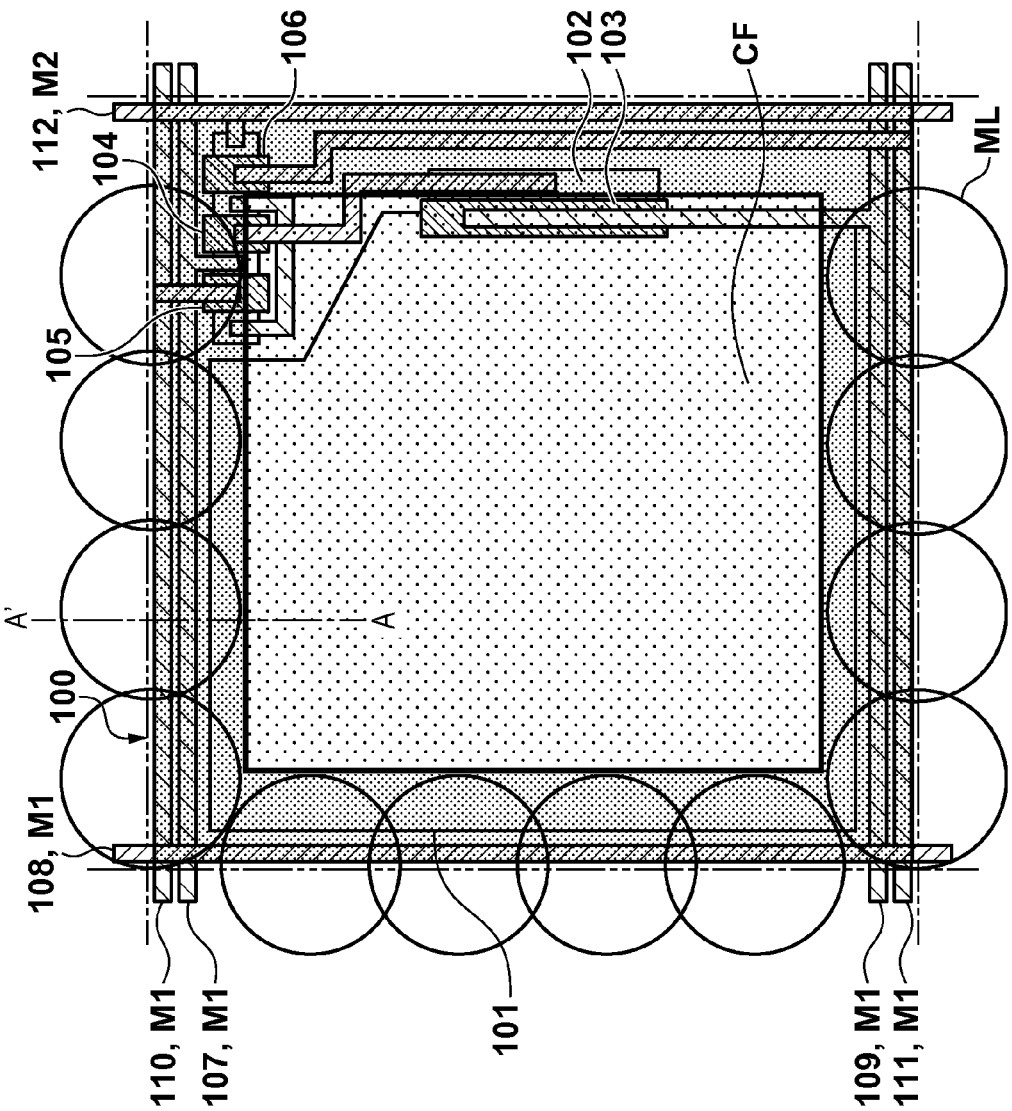
FIG. 16 is a view for explaining an example of the arrangement of the sixth embodiment.

In the sixth embodiment, a matrix of color filters CF is different from the fifth embodiment. FIG. 16 is a schematic view of a unit pixel 100 of a pixel portion in this embodiment, when it is illustrated from the upper surface side, and is the same as the fifth embodiment (FIG. 14) except for the arrangement of the color filter CF.

Figure 17:
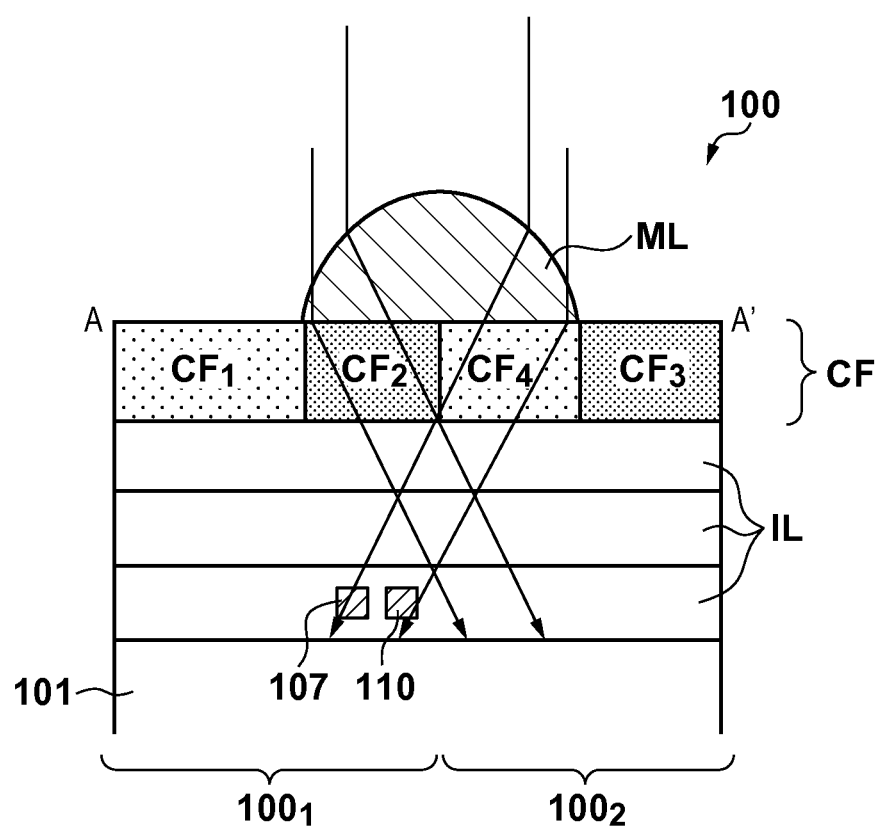
FIG. 17 is a view for explaining a schematic sectional arrangement of a pixel of the sixth embodiment.

FIG. 17 is a schematic view of the sectional structure taken along a cut line A-A' in FIG. 16. As exemplified in FIG. 17, a color filter CF of a pixel $100_1$ includes a first portion $CF_1$ and second portion $CF_2$. Also, a color filter CF of a pixel $100_2$ includes a third portion $CF_3$ and fourth portion $CF_3$.

In this case, the first portion $CF_1$ and fourth portion $CF_4$ transmit, through themselves, light of a color to be photoelectrically converted by a photodiode 101 of the pixel $100_1$. The second portion $CF_2$ and third portion $CF_3$ transmit, through themselves, light of a color to be photoelectrically converted by a photodiode 101 of the pixel $100_2$. For example, when the pixel $100_1$ is a green pixel, the first portion $CF_1$ and fourth portion $CF_4$ transmit, through themselves, green light. Also, when the pixel $100_2$ is a red pixel (or blue pixel), the second portion $CF_2$ and third portion $CF_3$ transmit, through themselves, red light (or blue light).

With this structure, of light rays which perpendicularly enter the pixel $100_2$, those which are refracted by the microlens ML toward the side of the pixel $100_1$ are transmitted through the fourth portion $CF_4$. Thus, the light rays transmitted through this fourth portion $CF_4$ and those which enter on the pixel $100_1$ and are transmitted through the first portion $CF_1$ are of the same color, no color mixture occurs between the pixels $100_1$ and $100_2$. Also, the same applies to light rays which are refracted by the microlens ML toward the side of the pixel $100_2$ of those which perpendicularly enter the pixel $100_1$, and are transmitted through the second portion $CF_2$.

As described above, according to this embodiment, the respective pixels 100 can eliminate false colors and moiré as in the fifth embodiment while eliminating color mixture with adjacent pixels.

Figure 13:
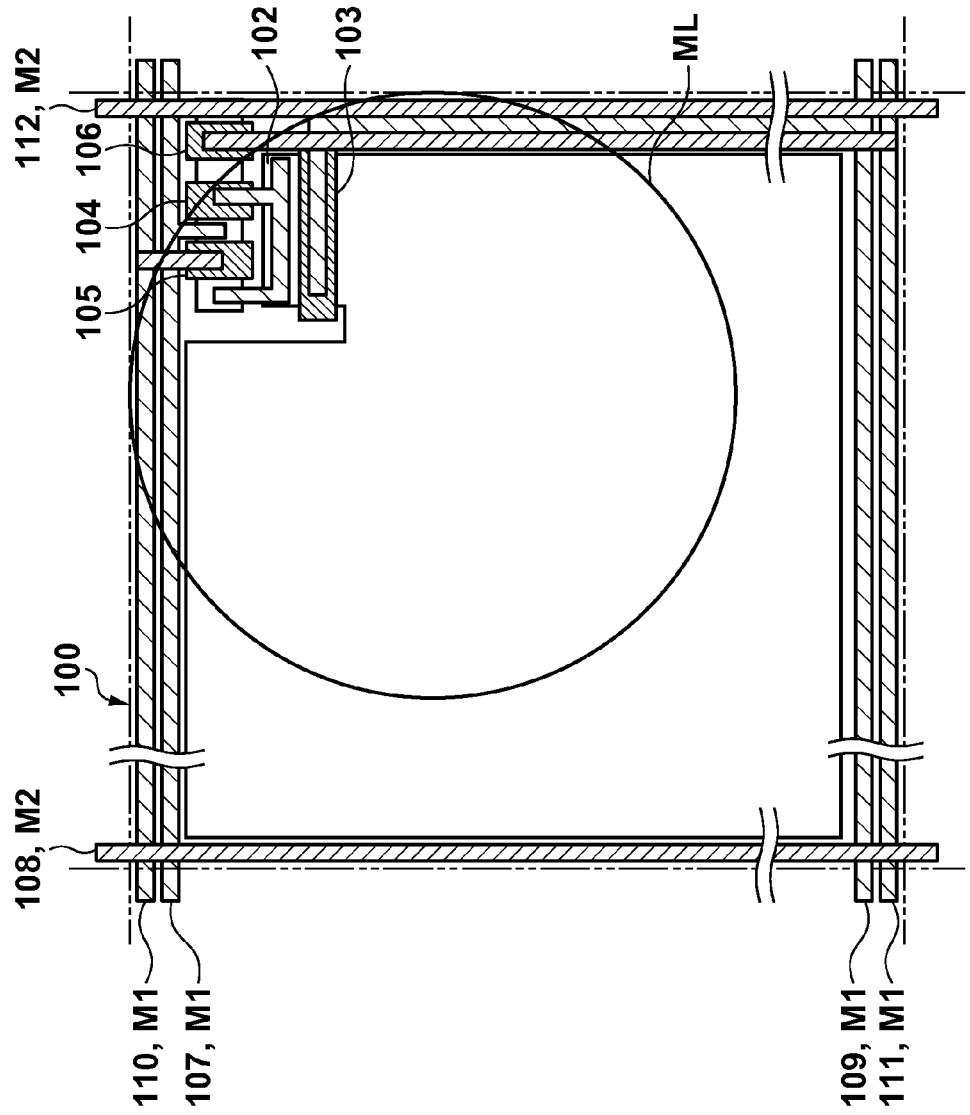
FIG. 13 is a view for explaining still another example of the arrangement.

The six embodiments have been explained. However, the present invention is not limited to these embodiments, objects, states, use applications, functions, and other specifications can be changed as needed, and the present invention can be practiced by other embodiments. For example, as shown in FIG. 13, the respective elements 102 to 106 may be arranged together on a portion of a corner of the pixel 100, and the respective interconnections may be arranged on a region which isolates the photodiode 101 and that of an adjacent pixel. In this case, only one light-condensing portion (microlens ML in this case) may be arranged immediately above the photodiode 101 so as to refract light rays, which enter the respective transistors, toward the photodiode 101. Also, when, for example, the light-condensing portion is the microlens ML having the spherical surface shape, the width of the light-condensing portion includes the diameter which is defined previously. Also, the light-condensing portion is not limited to the spherical surface shape (described as the microlens in this case) or cylindrical surface shape (described as the cylindrical lens in this case), and may have other shapes. The respective embodiments can be changed or combined as needed.

The aforementioned embodiments have been described in association with the imaging apparatus, included in the imaging system representing a camera. However, the concept of the imaging system includes not only an apparatus which is primarily intended to imaging, but also an apparatus having an imaging function as an auxiliary function (for example, a personal computer or mobile terminal). The imaging system can include the imaging apparatus according to the present invention, which apparatus has been exemplified as each of the above embodiments, and a processing unit which processes signals output from this imaging apparatus. This processing unit can include, for example, an A/D converter and a processor which processes digital data output from this A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2012-027724, filed Feb. 10, 2012 and 2013-004051, filed Jan. 11, 2013, which are hereby incorporated by reference herein in their entirety.

What is claimed is:

1. An imaging apparatus comprising a plurality of pixels, arranged on a substrate,
   each of the plurality of pixels including:
      a photoelectric conversion portion;
      a plurality of transistors for reading out a signal corresponding to a charge generated in the photoelectric conversion portion;
      a color filter arranged above the photoelectric conversion portion; and
      a plurality of microlenses arranged above the color filter,
         wherein, in a planer view from an upper surface of the substrate, each of the plurality of microlenses has an area smaller than an area of the photoelectric conversion portion.

2. The apparatus according to claim 1, wherein, in the planer view, each of the plurality of microlenses has a width smaller than a width of the photoelectric conversion portion.

3. The apparatus according to claim 1, wherein the plurality of pixels are arrayed two-dimensionally and, in the planer view, at least two microlenses among the plurality of microlenses are arranged along the arrayed direction.

4. The apparatus according to claim 3, wherein, in the planer view, at least one of the microlenses has a width different from widths of the remaining microlenses.

5. The apparatus according to claim 1, wherein, in the planer view, at least two microlenses among the plurality of microlenses are arranged along an outer edge of the photoelectric conversion portion.

6. The apparatus according to claim 1, wherein at least one of the plurality of microlenses has one of a cylindrical surface shape and spherical surface shape.

7. The apparatus according to claim 1, wherein, in the planer view, each of the plurality of microlenses is located so as to shift from a central portion of the photoelectric conversion portion.

8. The apparatus according to claim 1, wherein, in the planer view, each of the plurality of pixels has a central region and its peripheral region, the photoelectric conversion portion is arranged in the central region, and the transistors are arranged in the peripheral region, and
   the apparatus further comprises a plurality of wirings connected to the transistors, the plurality of wirings being arranged in the peripheral region of each of the plurality of pixels so as to surround the central region of each of the plurality of pixels in the planer view.

9. The apparatus according to claim 8, wherein, in each of the plurality of pixels, part of at least one of the plurality of microlenses overlaps with the plurality of wirings in the planer view.

10. An imaging system comprising:
    an imaging apparatus; and
    a processing unit which processes a signal output from said imaging apparatus,
    wherein the imaging apparatus comprises a plurality of pixels arranged on a substrate,
    wherein each of the plurality of pixels includes:
       a photoelectric conversion portion,
       a plurality of transistors for reading out a signal corresponding to a charge generated in the photoelectric conversion portion,
       a color filter arranged above the photoelectric conversion portion, and
       a plurality of microlenses arranged above the color filter, and
    wherein, in a planer view from an upper surface of the substrate, each of the plurality of microlenses has an area smaller than an area of the photoelectric conversion portion.

* * * * *